United States Patent
Norton (10) Patent No.: US 10,321,605 B2
(45) Date of Patent: Jun. 11, 2019

(54) HEAT SINK

(71) Applicant: Hewlett-Packard Development Company, L.P., Houston, TX (US)

(72) Inventor: John Norton, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 403 days.

(21) Appl. No.: 14/906,235

(22) PCT Filed: Jul. 22, 2013

(86) PCT No.: PCT/US2013/051522
§ 371 (c)(1),
(2) Date: Jan. 19, 2016

(87) PCT Pub. No.: WO2015/012797
PCT Pub. Date: Jan. 29, 2015

(65) Prior Publication Data
US 2016/0165757 A1    Jun. 9, 2016

(51) Int. Cl.
*H01L 23/40* (2006.01)
*H05K 7/20* (2006.01)
(Continued)

(52) U.S. Cl.
CPC .......... *H05K 7/20336* (2013.01); *B23P 15/26* (2013.01); *H01L 23/3672* (2013.01); *H01L 23/40* (2013.01); *H01L 23/427* (2013.01); *H01L 23/467* (2013.01); *B23P 2700/09* (2013.01); *B23P 2700/10* (2013.01); *H01L 2924/0002* (2013.01)

(58) Field of Classification Search
CPC ..... H01L 23/4006; H01L 23/427; H05K 7/20; F28D 15/0275
USPC .......... 165/80.2, 80.3, 104.33, 185; 361/700, 361/710
See application file for complete search history.

(56) References Cited

U.S. PATENT DOCUMENTS

| | | | |
|---|---|---|---|
| 4,315,300 A | 2/1982 | Parmerlee et al. | |
| 4,341,432 A | 7/1982 | Cutchaw | |

(Continued)

FOREIGN PATENT DOCUMENTS

| | | |
|---|---|---|
| CN | 2677989 Y | 2/2005 |
| CN | 101374401 | 2/2009 |

(Continued)

OTHER PUBLICATIONS

CN First Office Action dated Dec. 26, 2016, CN Patent Application No. 201380078142.3 dated Jul. 22, 2013, State Intellectual Property Office of the P.R. China, 8 pages.
(Continued)

*Primary Examiner* — Allen J Flanigan
(74) *Attorney, Agent, or Firm* — Hewlett Packard Enterprise Patent Department (57) ABSTRACT

A heat sink assembly is provided herein. The heat sink assembly includes at least two heat sinks, a mechanical support member, and a flexible heat pipe. Each of the at least two heat sinks are formed to mate with one of at least two processors. The mechanical support member are formed to mechanically engage with the at least two heat sinks. The flexible heat pipe connects to the at least two heat sinks to provide a thermal link therebetween.

20 Claims, 8 Drawing Sheets

(51) Int. Cl.
*H01L 23/367* (2006.01)
*H01L 23/427* (2006.01)
*H01L 23/467* (2006.01)
*B23P 15/26* (2006.01)

(56) References Cited

U.S. PATENT DOCUMENTS

| | | | |
|---|---|---|---|
| 5,289,342 | A | 2/1994 | Spalding et al. |
| 5,343,358 | A | 8/1994 | Hilbrink |
| 5,353,191 | A | 10/1994 | Volz et al. |
| 5,696,405 | A | 12/1997 | Weld |
| 5,712,762 | A | 1/1998 | Webb |
| 5,757,615 | A | 5/1998 | Donahoe et al. |
| 5,764,483 | A | 6/1998 | Ohashi et al. |
| 7,295,437 | B2 | 11/2007 | Lee et al. |
| 7,327,571 | B2 | 2/2008 | Giardina et al. |
| 7,697,293 | B1 * | 4/2010 | Peng et al. ............ H01L 23/427 165/104.26 |
| 7,782,617 | B2 | 8/2010 | Li et al. |
| 7,990,719 | B2 | 8/2011 | Chen et al. |
| 2005/0167083 | A1 | 8/2005 | Belady et al. |
| 2006/0238982 | A1 * | 10/2006 | Lee et al. ............ H01L 23/427 361/700 |
| 2007/0215319 | A1 * | 9/2007 | Chen et al. ............ H01L 23/427 165/80.3 |
| 2007/0279872 | A1 * | 12/2007 | Lai et al. ............ H01L 21/4882 361/710 |
| 2008/0218964 | A1 | 9/2008 | Chang |
| 2009/0071632 | A1 | 3/2009 | Bryant et al. |
| 2009/0211730 | A1 * | 8/2009 | Zhou et al. ......... H01L 23/3672 165/80.3 |
| 2014/0069611 | A1 * | 3/2014 | Liu et al. ................ H01L 23/36 165/80.3 |

FOREIGN PATENT DOCUMENTS

| | | |
|---|---|---|
| CN | 101516170 | 8/2009 |
| CN | 102449759 | 5/2012 |
| JP | 08290225 | 11/1996 |
| TW | 375922 | 3/2010 |
| WO | WO-2012149786 A1 | 11/2012 |

OTHER PUBLICATIONS

Extended European search report dated Feb. 1, 2017 for EP application No. 13890131.9; pp. 8.
PCT/ISA/KR, International Search Report dated Mar. 19, 2014, PCT/US2013/051522, 10 pps.
Takmai, K.M.; Simulation of a Novel Copper Heat Sink Using Copper Pipe and Am Method for CPU Group Heat Removing in Power Transformer; http://ieeexplore.ieee.org/stamp/jsp?arnumber=4441469 > on pp. 1-8; Aug. 14-17, 2007.

* cited by examiner

HEAT SINK MODULE
300

FIRST PROCESSOR
305

SECOND PROCESSOR
310

FIRST HEAT SINK
120

SECOND HEAT SINK
140

MECHANICAL SUPPORT MEMBER
160

FLEXIBLE HEAT PIPE
180

```
ALIGN THE FIRST CENTRAL PROCESSING UNIT
AND THE FIRST HEAT SINK WITH A FIRST
CENTRAL PROCESSING UNIT JACKET
810
           │
           ▼
ALIGN THE SECOND CENTRAL PROCESSING
UNIT AND THE SECOND HEAT SINK WITH A
SECOND CENTRAL PROCESSING UNIT JACKET
830
           │
           ▼
GUIDE THE DUAL CENTRAL PROCESSING UNIT
HEAT SINK MODULE INTO A CENTRAL
PROCESSING UNIT SOCKET USING THE FIRST
CENTRAL PROCESSING UNIT JACKET AND THE
SECOND CENTRAL PROCESSING UNIT JACKET
850
```

*Fig. 8*

HEAT SINK

BACKGROUND

Electronic devices have temperature requirements. For example, a plurality of central processing units are used in virtualized server environments. Heat is removed using heat sinks. The heat sinks are connected to each central processing unit. The work load between the central processing units may be uneven, leading to uneven thermal loads between the central processing units.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

In examples, a heat sink assembly is provided herein. The heat sink assembly includes at least two heat sinks, a mechanical support member, and a flexible heat pipe. Each of the at least two heat sinks are formed to mate with one of at least two processors. The mechanical support member is formed to mechanically engage with the at least two heat sinks. The flexible heat pipe connects the at least two heat sinks to provide a thermal link therebetween. The flexible heat pipe that connects the at least two heat sinks distributes the heat between the at least two heat sinks. The heat sink assembly provides a mechanical connection between the at least two heat sinks using the mechanical support member. The heat sink assembly also provides a thermal connection between the at least two heat sinks.

As used herein, the phrase "flexible heat pipe" refers to a thermally conductive material that is able to adjust or conform to enable two objects that are connected by the thermally conductive material to be positioned on different planes. For example, the thermally conductive material may be a heat pipe that is formed to bend. The bending provides flexibility to enable positioning of two objects connected to the same heat pipe to be positioned on two distinct processor seating planes. The flexibility may be in the form of a hinge, spring, or bellow in the heat pipe or a property of the thermally conductive material that enables a slight bend or non-rigid positioning.

As used herein, the phrase "seating plane" refers to a plane on which an object sits. For example, two processors may each be seated or positioned on a motherboard. Each processor may have a separate seating plane that is different in terms of height above the motherboard the difference in height may provide a small offset.

Figure 1:
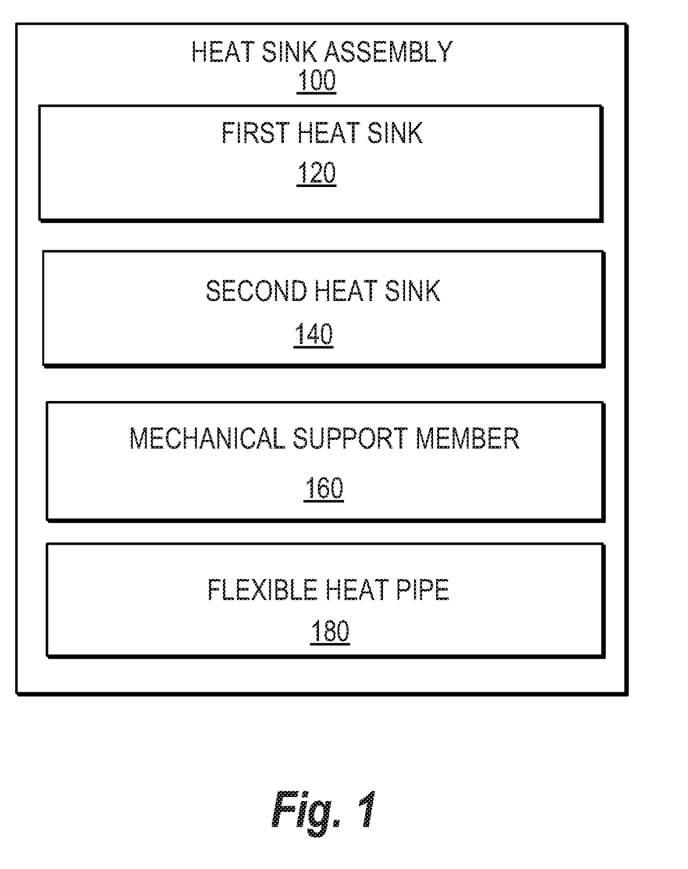
FIG. 1 illustrates a block diagram of a heat sink assembly according to an example.

FIG. 1 illustrates a block diagram of a heat sink assembly 100 according to an example. The heat sink assembly 100 includes a first heat sink 120, a second heat sink 140, a mechanical support member 160, and a flexible heat pipe 180. The first heat sink 120 is formed to mate with a first processor along a first processor seating plane. The second heat sink 140 is formed to mate with a second processor along a second processor seating plane. The mechanical support member 160 is formed to support the first heat sink 120 along the first processor seating plane and the second heat sink 140 along the second processor seating plane. The flexible heat pipe 180 is between the first heat sink 120 and the second heat sink 140 to provide a thermal link therebetween.

Figure 2:
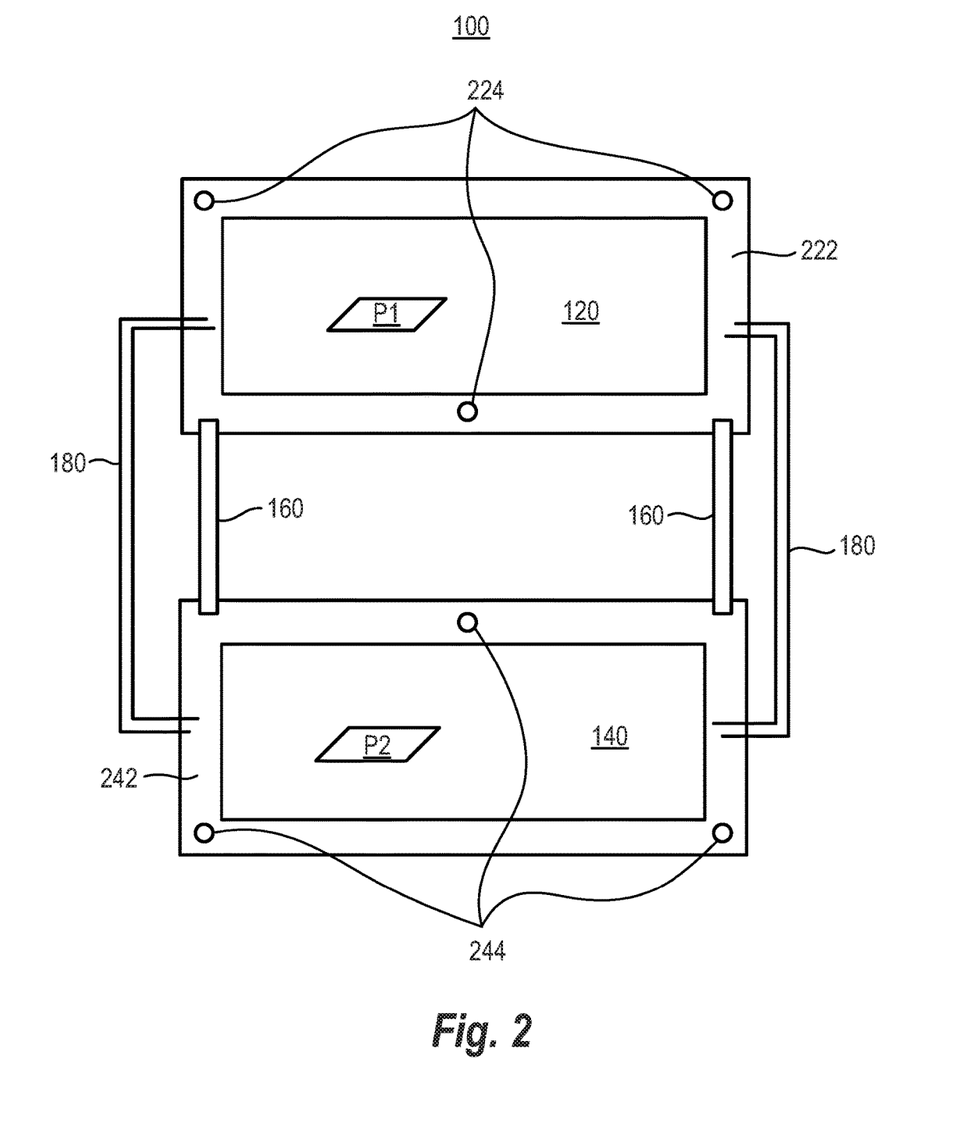
FIG. 2 illustrates a schematic diagram of the heat sink assembly of FIG. 1 according to an example.

FIG. 2 illustrates a schematic diagram of the heat sink assembly 100 of FIG. 1 according to an example. Referring to FIG. 2, the heat sink assembly 100 includes the first heat sink 120, the second heat sink 140, a mechanical support 160, and a flexible heat pipe 180. The first heat sink 120 is illustrated to include a first heat sink base 222 and a first set of alignment members 224 to align the first heat sink 120 with a first processor using for example, a first processor jacket. The second heat sink 140 is similarly illustrated to include a second heat sink base 242 and a second set of alignment members 244 to align the second heat sink 140 with a second processor using for example, a second processor jacket.

The mechanical support member 160 is illustrated to provide a mechanical support for the first heat sink 120 and the second heat sink 140 and provide flexibility for an offset between the first heat sink 120 and the second heat sink 140. For example, the mechanical support member 160 may include a plastic composition to provide mechanical connection between the first heat sink 120 and second heat sink 140 while remaining elastic and flexible enough to allow for the small offset between the first processor seating plane P1 and the second processor seating plane P2. The first processor seating plane P1 and the second processor seating plane P2 lie along two distinct planes.

The flexible heat pipe 180 to provide a thermal connection between two heat sinks to allow movement between the first heat sink 120 and the second heat sink 140 for an offset between the first processor seating plane P1 and the second processor seating plane P2. The movement may be provided by elasticity in the flexible heat pipe 180 to allow a small amount of movement to allow for the small offset between the first heat sink 120 and the second heat sink 140 along distinct processor seating planes. For example, the flexible heat pipe 180 may include a plurality of flexible heat pipes 180 that connect at least two heat sinks to one another. The flexible heat pipe 180 may form a connection between a first heat sink base 222 formed in the first heat sink 120 and a second heat sink base 242 formed in the second heat sink 140. Alternatively, the flexible heat pipe 180 may form a connection between a first set of fins formed in the first heat sink 120 and a second set of fins formed in the second heat sink 120 as illustrated below in FIGS. 5-6.

By connecting the heat sinks 120, 140 to one another, the thermal load may be distributed between the two heat sinks to adjust for an uneven thermal load produced by the two processors that are attached to the two heat sinks 120, 140. For example, a first processor may be providing a significant amount of heat. The flexible heat pipe 180 may connect the first heat sink 120 of the first processor to the second heat sink 140 of the second processor to distribute the heat and allow for a more even thermal load between the two heat sinks 120, 140.

Figure 3:
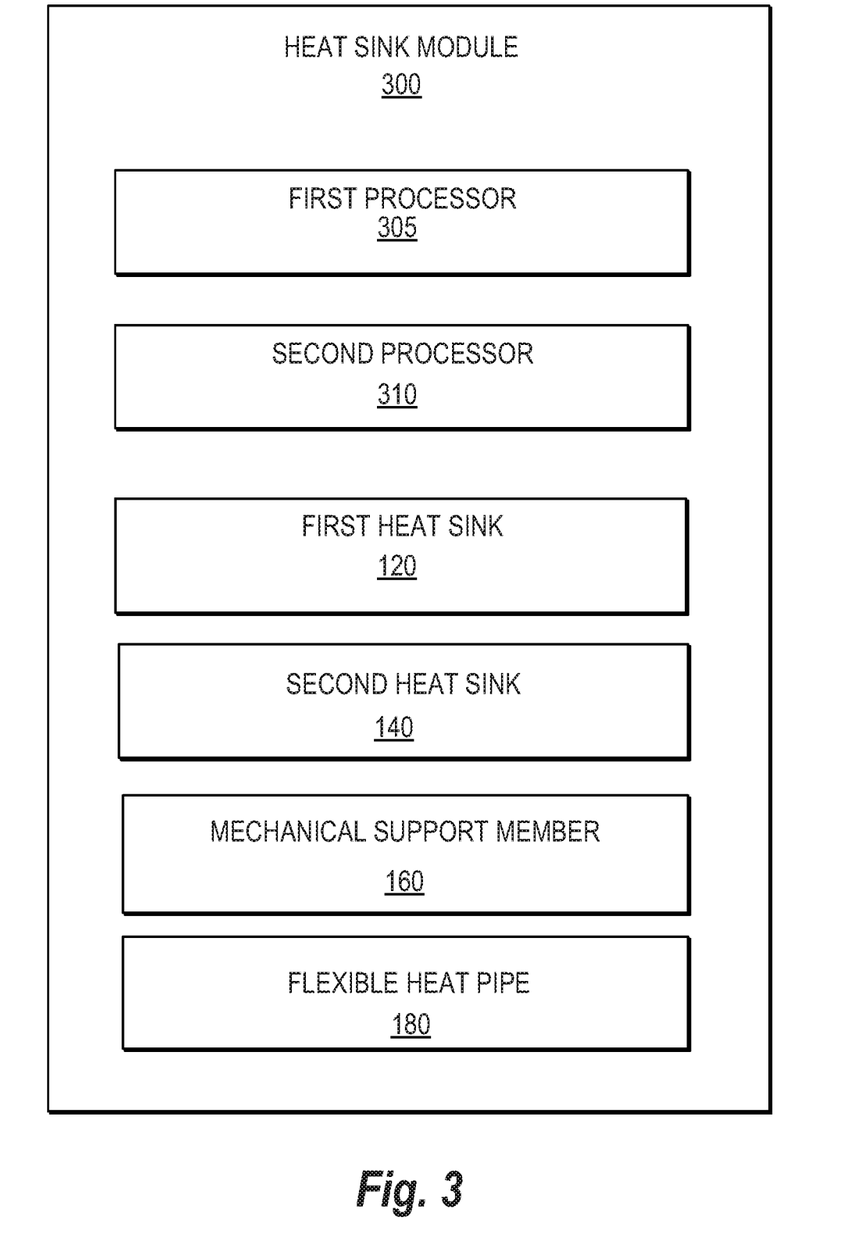
FIG. 3 illustrates a block diagram of a heat sink module according to an example.

FIG. 3 illustrates a block diagram of a heat sink module 300 according to an example. The heat sink module 300 includes at least two processors, at least two heat sinks, a mechanical support member 160 and a flexible heat pipe 180. The at least two processors are illustrated as a first processor 305 and a second processor 310. Each of the at least two processors are positioned along a distinct processor seating plane. The at least two heat sinks are illustrated as the first heat sink 120 and the second heat sink 140. Each of the at least two heat sinks are formed to mate with one of the at least two processors. The mechanical support member 160 is formed to mechanically engage with the at least two heat sinks. The flexible heat pipe 180 is connected between the at least two heat sinks to provide a thermal link therebetween.

Figure 4:
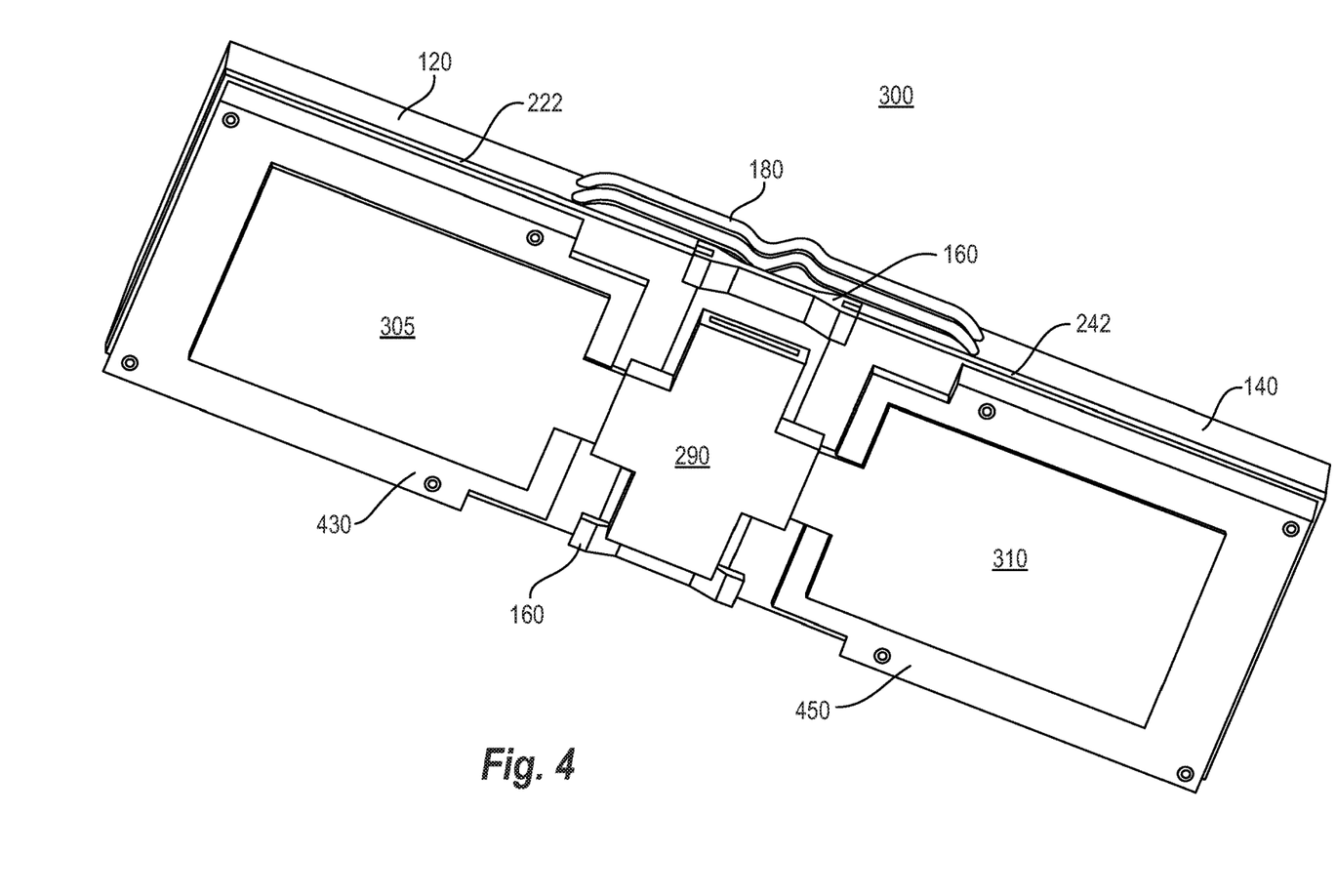
FIGS. 4-5 illustrate perspective diagrams of the heat sink module of FIG. 3 according to examples.
Figure 5:
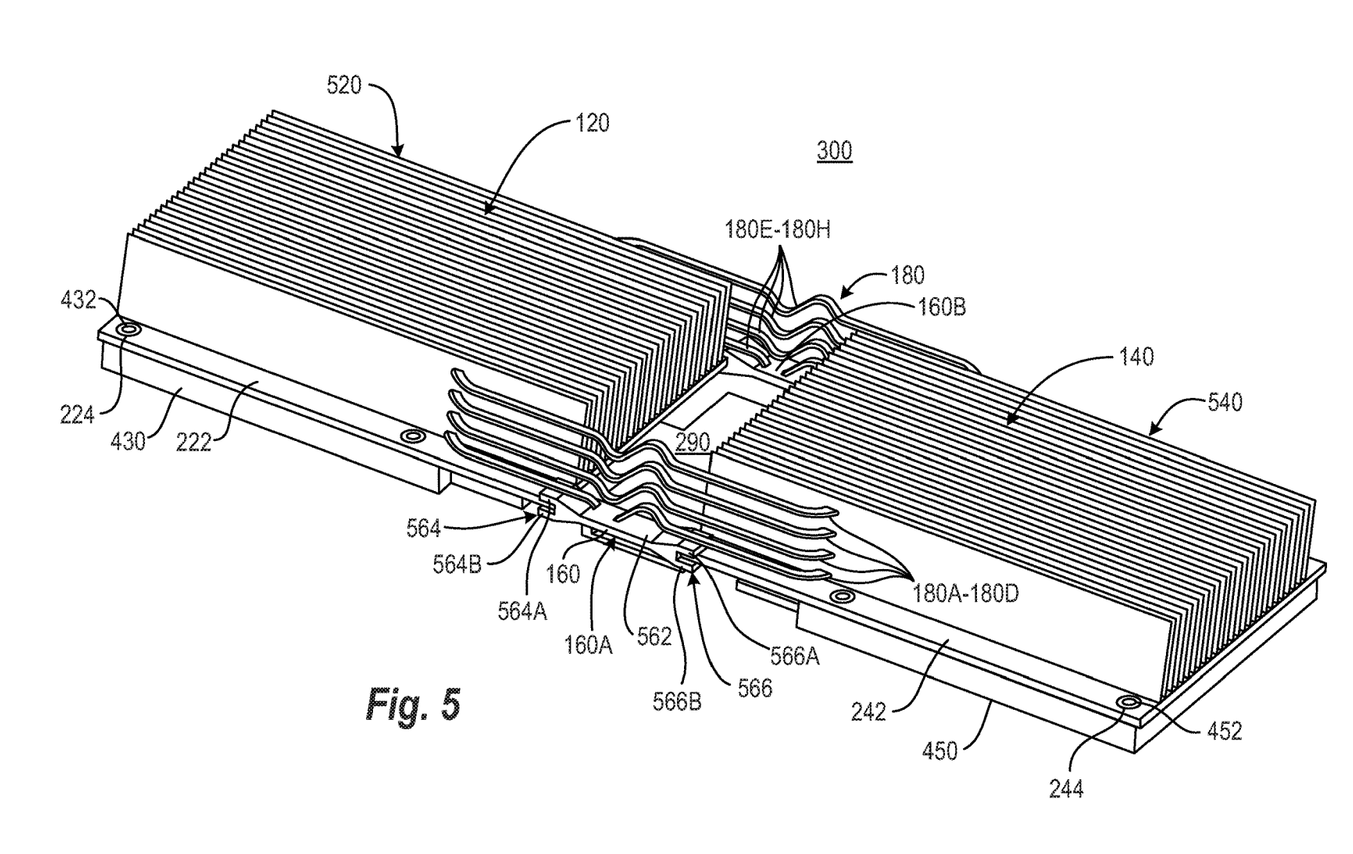

FIGS. 4-5 illustrate perspective diagrams of the heat sink module 300 of FIG. 3 according to examples. Referring to FIGS. 4-5, the heat sink module 300 includes a first processor 305, a second processor 310, a first heat sink 120, a second heat sink 140, a mechanical support member 160, and a flexible heat pipe 180. The first heat sink 120 is illustrated as mating with the first processor 305. The second heat sink 140 is illustrated as mating with the second processor 310. The heat sink module 300 may further include an electrical interconnect 290 to provide a direct electrical link between the at east two processors, i.e., a first processor 305 and a second processor 310.

FIG. 4 illustrates a bottom view of the heat sink module 300 according to an example. As illustrated in FIG. 4, the heat sink module 300 may further include two central processing unit jackets. One of the at least two central processing unit jackets formed to attach to each of the at least two central processing units and align each of the at least two central processing units with each of the at least two heat sinks, respectively. For example, a first central processing unit jacket 430 is formed to attach to the first central processing unit 305 and align the first central processing unit 305 with the first heat sink 120. A second central processing unit jacket 450 is formed to attach to the second central processing unit 310 and align the second central processing unit 310 with the second heat sink 140.

FIG. 5 illustrates a top view of the heat sink module 300 according to an example. The example, illustrates the alignment between the heat sinks and the central processing units using the at least two central processing unit jackets. Referring to FIG. 5, a first central processing unit jacket 430 positions the first heat sink 120 on the first processor 305 via a jacket alignment member, illustrated as a first jacket alignment member 432. Similarly, the second central processing unit jacket 450 positions the second heat sink 140 on the second processor 310 using a jacket member, illustrated as a second jacket alignment member 452.

For example, first heat sink alignment member 224 mates with the first jacket alignment member 432 and the second heat sink alignment member 244 mates with the second jacket alignment member 452. The first heat sink alignment member 224 may include apertures in the first heat sink base 222 that receive the first jacket alignment member 432, such as a protrusion from the first central processing unit jacket 430. Similarly, the second heat sink alignment member 244 may include apertures in the second heat sink base 242 that receive the second jacket alignment member 45, such as a protrusion from the second central processing unit jacket 450. The first heat sink base 222 and the second heat sink base 242 may also include additional features to guide the heat sink module 300 into a central processing unit socket on a server chassis.

The mechanical support member 160 is formed to mechanically engage with the at least two heat sinks 120, 140. The mechanical support member 160 is illustrated as two mechanical support members 160A-B. Each mechanical support member 180 is illustrated as being formed of a planar member 562 with a pair of engagement members 564, 566 at opposite ends of the planar member. The planar member 562 is formed of a material that provides the mechanical support between the at least two heat sinks 120, 140, while allowing for a small offset between two processor seating planes. For example, the planar member 662 may bend or adjust to allow the first heat sink 120 to lie flush with a first central processing unit 305 and the second heat sink 140 to lie flush with the second central processing unit 310, when the first and second central processing units 305, 310 are positioned along two distinct processor seating planes. Each engagement member 564, 666 is illustrated to include two extensions, i.e., 564A, 564B, 566A, 5668 spaced apart from one another and formed to engage with a heat sink, i.e., 120, 140. For example, the engagement members 564, 566 form a U-shaped opening that receives the heat sink base 222, 242.

The flexible heat pipe 180 is connected between the at least two heat sinks to provide a thermal link therebetween. The flexible heat pipe 180 is illustrated as two sets of four heat pipes 180A-180H on opposite sides of the first and second heat sinks 120, 140. The flexible heat pipes 180A-180H are illustrated as connected to a first set of fins 520 of the first heat sink 120 and the second set of fins 540 of the second heat sink 140; however, the flexible heat pipes 180 may also be connected to first heat sink 120 via the first heat sink base 222 and the second heat sink 140 via the second heat sink base 242, as illustrated in FIG. 2.

The connection of the flexible heat pipe 180 between the at least two heat sinks provides thermal efficiency by thermally coupling the at least two heat sinks, which are each coupled to a central processing unit. The connection links the heat sinks, i.e., 120, 140 to one another, such that the thermal load may be distributed between the two heat sinks and such a configuration adjusts for an uneven thermal load produced by the two processors that are attached to the two heat sinks 120, 140. For example, the first processor 430 may be using a large amount processing resources that produces a significant amount of heat. The second processor 450 may not be using very much of the processing resources. The flexible heat pipe 180 enables thermal efficiency through the connection between the first heat sink 120 of the first processor 430 and the second heat sink 140 of the second processor. The flexible heat pipe 180 may then distribute the heat between the first heat sink 120 and the second heat sink 140 to allow for a more even thermal load between the two heat sinks 120, 140.

Figure 6:
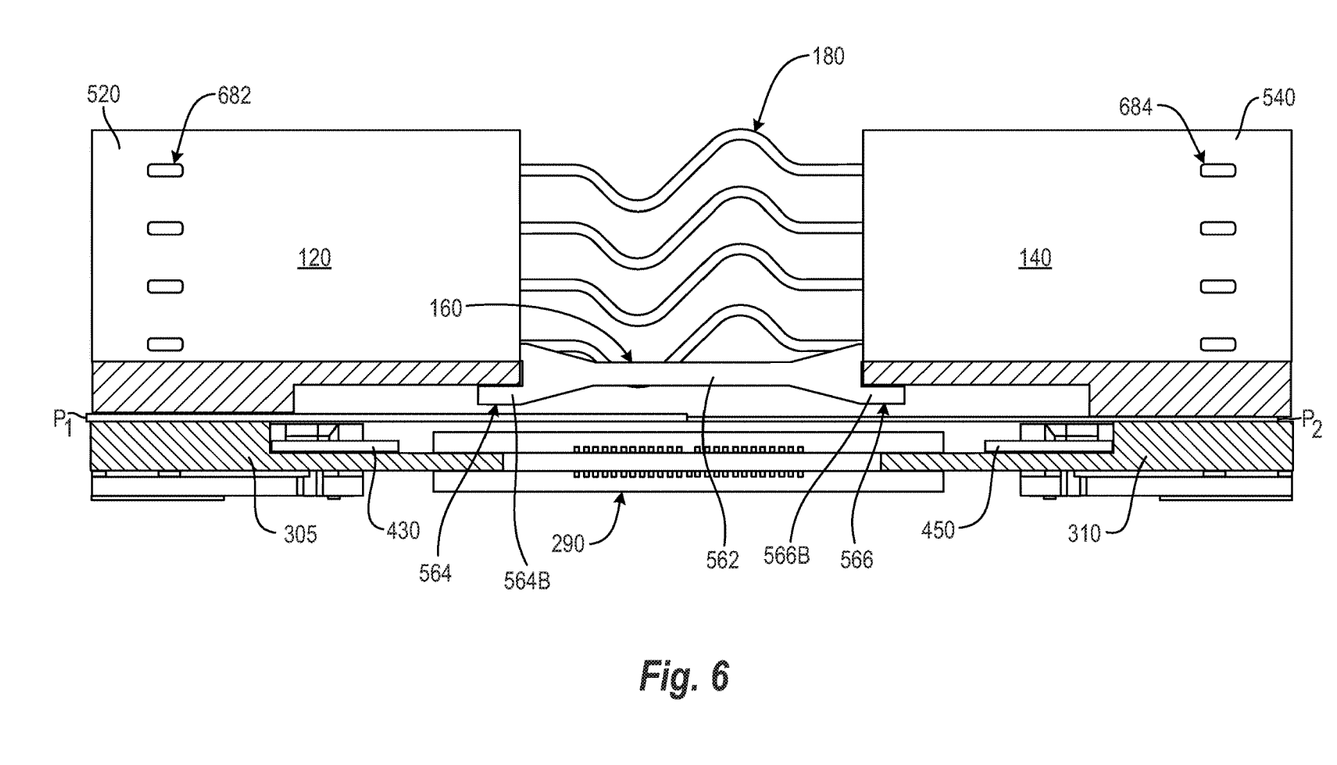
FIG. 6 illustrates a cross-sectional view of the heat sink module of FIG. 3 according to an example.

FIG. 6 illustrates a cross-sectional view of the heat sink module of FIG. 3 according to an example. As illustrated in FIG. 6, the mechanical support member 160 is not ridged, but instead is flexible enough to balance an offset between the at least two heat sinks, i.e., the first heat sink 120 and the second heat sink 140. For example, the mechanical support member 160 may include a plastic composition that bends to provide mechanical support for the first heat sink 120 along the first processor seating plane P1 and between the second heat sink 140 along the second processor seating plane P2, such that the first processor seating plane P1 and the second processor seating plane P2 lie along two distinct planes.

FIG. 6, further illustrates the flexible heat pipe 180 embedded between a set of heat sink fins 520, 540 on each of the at least two heat sinks to form the thermal link between the first and second heat sink 120, 140. The cross-sectional view illustrates a first fin interface 682 between a first set of fins 520 of the first heat sink 120 and the flexible heat pipe 180, and a second fin interface 684 between the second set of fins 540 of the second heat sink 140 and the flexible heat pipe 180. Alternatively, and/or in addition, the flexible heat pipe 180 may be connected between a heat sink base 222, 242 on each of the two heat sinks 120, 140 to form the thermal link, as illustrated above in FIG. 2. The flexible heat pipe 180 may include one heat pipe or a plurality of heat pipes formed to connect between the at least two heat sinks, such that the heat pipes allow for a small amount of movement between the first processor seating plane P1 and the second processor seating plane P2. Moreover, the electrical interconnect 290 is also formed to adjust for an offset between the first processor seating plane P1 and the second processor seating plane P2.

Figure 7:
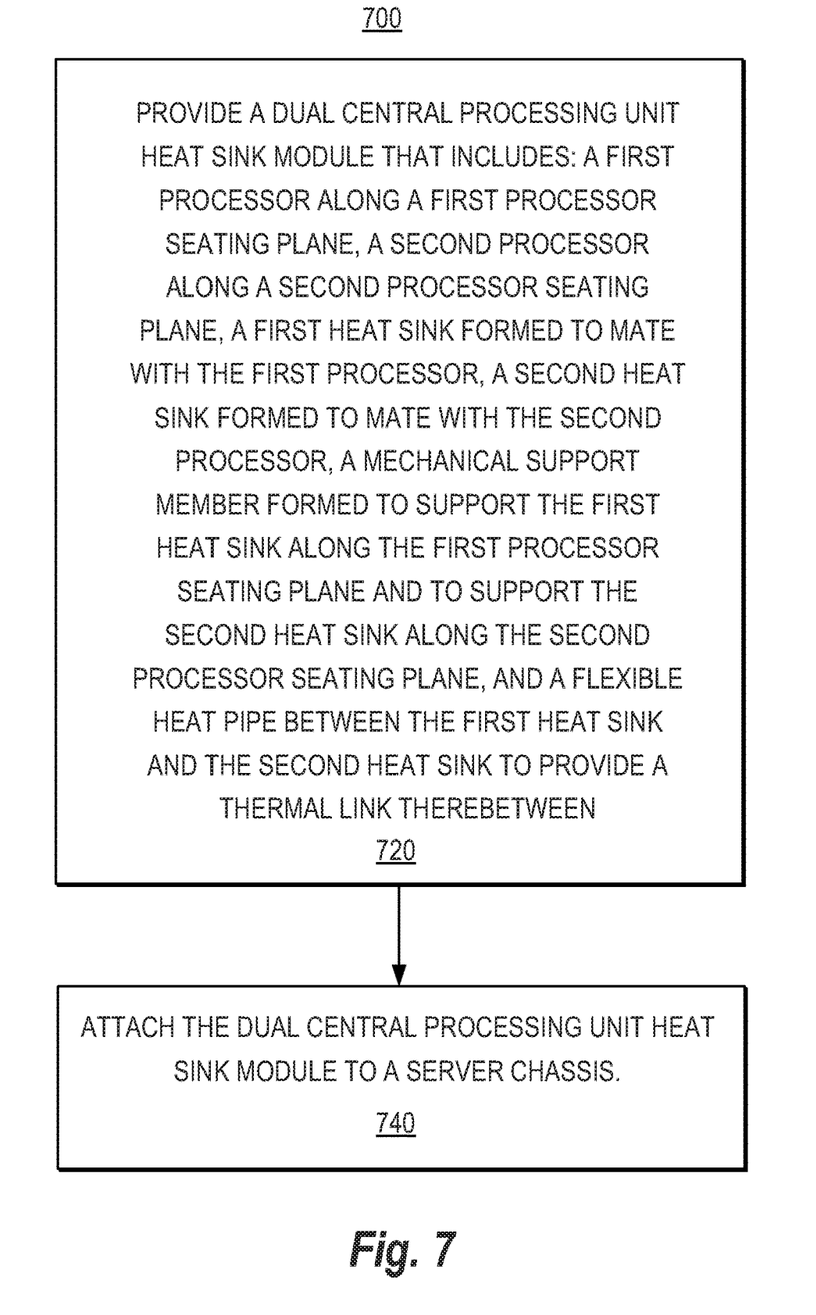
FIGS. 7-8 illustrate flow charts of a method to install a dual central processing unit heat sink module according to examples.
Figure 8:
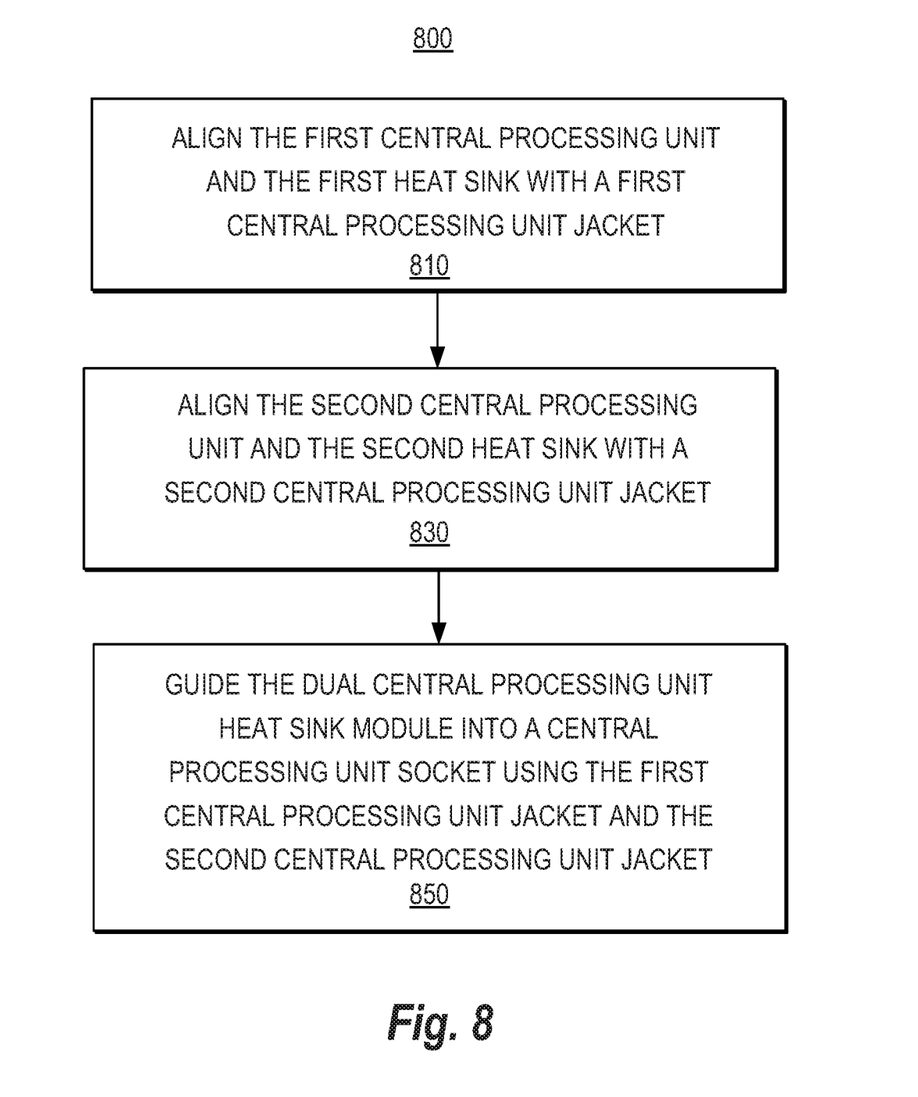

FIGS. 7-8 illustrate flow charts 700, 800 of a method to install a dual central processing unit heat sink module according to examples. Referring to FIG. 7, the method provides the dual central processing unit heat sink module in block 720. The dual central processing unit includes a first processor, a second processor, a first heat sink, a second heat sink, a mechanical support, and a flexible heat pipe. The first processor is along a first processor seating plane and a second processor is along a second processor seating plane. The first heat sink is formed to mate with the first processor, and the second heat sink is formed to mate with the second processor. The mechanical support member is formed to support the first heat sink along the first processor seating plane and to support the second heat sink along the second processor seating plane. The flexible heat pipe is between the first heat sink and the second heat sink to provide a thermal link therebetween. The dual central processing unit heat sink module may further include an electrical bridge to directly connect the first central processing unit and the second central processing unit.

In block 740, the dual central processing unit heat sink module is attached to a server chassis. For example, referring to FIG. 8, the dual central processing unit heat sink module is attached as follows. In block 810, the first central processing unit and the first heat sink are aligned using a first central processing unit jacket. The second central processing unit and the second heat sink are aligned using a second central processing unit jacket in block 830. The first central processing unit jacket and the second central processing unit jacket guide the dual central processing unit heat sink module into a central processing unit socket in block 850.

Although the flow diagrams of FIGS. 7-8 illustrate specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present invention.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A heat sink assembly comprising:
   a first heat sink, formed to mate with a first processor along a first processor seating plane;
   a second heat sink, formed to mate with a second processor along a second processor seating plane;
   a mechanical support member that bends in correspondence with a height difference between the first processor seating plane and the second processor seating plane and formed to support the first heat sink and the second heat sink along the first processor seating plane and the second processor seating plane, respectively; and
   a flexible heat pipe between the first heat sink and the second heat sink to provide a thermal link therebetween.

2. The heat sink assembly of claim 1, wherein the flexible heat pipe to allow movement for an offset between the first heat sink and the second heat sink.

3. The heat sink assembly of claim 1, wherein the mechanical support member to provide flexibility for an offset between the first heat sink and the second heat sink.

4. The heat sink assembly of claim 1, wherein the flexible heat pipe forms a connection between a first set of fins formed in the first heat sink and a second set of fins formed in the second heat sink.

5. The heat sink assembly of claim 1, wherein the flexible heat pipe forms a connection between a first heat sink base formed in the first heat sink and a heat sink second base formed in the second heat sink.

6. The heat sink assembly of claim 1, wherein the mechanical support member comprises an elastic composition to provide mechanical support for the first heat sink along the first processor seating plane and the second heat sink along the second processor seating plane, wherein the first processor seating plane and the second processor seating plane lie along two distinct planes.

7. The heat sink assembly of claim 1, wherein the mechanical support member comprises a composition that allows for a small offset between the first processor seating plane and the second processor seating plane.

8. A heat sink module comprising:
   at least two processors, each of the at least two processors positioned along a distinct processor seating plane;

at least two heat sinks, each of the at least two heat sinks formed to mate with one of the at least two processors;

a mechanical support member that bends in correspondence with a height difference between the first processor and the second processor and formed to mechanically engage with the at least two heat sinks; and a flexible heat pipe to connect the at least two heat sinks to provide a thermal link therebetween.

9. The heat sink module of claim 8, further comprising at least two central processing unit jackets, one of the at least two central processing unit jackets formed to attach to each of the at least two central processing units and align each of the at least two central processing units with each of the at least two heat sinks, respectively.

10. The heat sink module of claim 8, wherein the thermal link forms by embedding the flexible heat pipe between a set of heat sink fins on each of the at least two heat sinks.

11. The heat sink module of claim 8, wherein the thermal link forms by connecting the flexible heat pipe between a heat sink base on each of the at least two heat sinks.

12. The heat sink module of claim 8, wherein the mechanical support member comprises a planar member and a pair of engagement members at opposite ends of the planar member.

13. The heat sink module of claim 8, further comprising an electrical interconnect to provide a direct electrical link between the at least two processors.

14. The heat sink assembly of claim 1, wherein the mechanical support member is flexible, flexibility of the mechanical support member permitting independent vertical positioning of the first heat sink and the second heat sink relative to one another in correspondence with a difference in height between the first heat sink and the second heat sink.

15. A heat sink assembly comprising:
a first heat sink, formed to mate with a first processor along a first processor seating plane;
a second heat sink, formed to mate with a second processor along a second processor seating plane;
a mechanical support member to support the first heat sink and the second heat sink along the first processor seating plane and the second processor seating plane, respectively; and
a flexible heat pipe between the first heat sink and the second heat sink to provide a thermal link therebetween, wherein each of the first and second heat sinks comprises a respective heat sink base, the heat sink base comprising:
a first portion to make thermal contact with a corresponding one of the first and second processors, and
a second portion extending past the first portion to engage with the mechanical support member.

16. The heat sink assembly of claim 15, wherein the mechanical support member comprises:
a pair of end portions, each end portion extending under and attached to a corresponding one of the first and second heat sinks; and
a middle portion between the end portions.

17. The heat sink assembly of claim 16, wherein each end portion of the mechanical support member has a vertical edge in contact with a vertical edge of the corresponding one of the first and second heat sinks.

18. The heat sink assembly of claim 16, wherein the first portion of each of the first and second heat sink bases opposes a corresponding one of the end portions of the mechanical support member.

19. The heat sink assembly of claim 15, wherein the first portion of each of the first and second heat sink bases is not in contact with the mechanical support member.

20. The heat sink assembly of claim 19, wherein the second portion of each of the first and second heat sink bases is not in contact with the corresponding one of the first and second processors.

* * * * *